(12) United States Patent
Sasaki et al.

(10) Patent No.: US 11,456,388 B2
(45) Date of Patent: Sep. 27, 2022

(54) TRENCH MOS SCHOTTKY DIODE AND METHOD FOR PRODUCING SAME

(71) Applicants: TAMURA CORPORATION, Tokyo (JP); Novel Crystal Technology, Inc., Saitama (JP); TDK Corporation, Tokyo (JP)

(72) Inventors: Kohei Sasaki, Saitama (JP); Minoru Fujita, Tokyo (JP); Jun Hirabayashi, Tokyo (JP); Jun Arima, Tokyo (JP)

(73) Assignees: Tamura Corporation, Tokyo (JP); Novel Crystal Technology, Inc., Saitama (JP); TDK Corporation, Tokyo (JP)

(*) Notice: Subject to any disclaimer, the term of this patent is extended or adjusted under 35 U.S.C. 154(b) by 0 days.

(21) Appl. No.: 16/977,190

(22) PCT Filed: Feb. 25, 2019

(86) PCT No.: PCT/JP2019/007029
§ 371 (c)(1),
(2) Date: Sep. 1, 2020

(87) PCT Pub. No.: WO2019/167873
PCT Pub. Date: Sep. 6, 2019

(65) Prior Publication Data
US 2021/0020789 A1    Jan. 21, 2021

(30) Foreign Application Priority Data
Mar. 1, 2018 (JP) .............................. JP2018-036901

(51) Int. Cl.
*H01L 29/872* (2006.01)
*H01L 29/423* (2006.01)
(Continued)

(52) U.S. Cl.
CPC ...... *H01L 29/872* (2013.01); *H01L 21/31116* (2013.01); *H01L 29/4236* (2013.01); *H01L 29/47* (2013.01); *H01L 29/66143* (2013.01)

(58) Field of Classification Search
CPC ... H01L 29/42; H01L 29/423; H01L 29/4236; H01L 29/47; H01L 29/66; H01L 29/661;
(Continued)

(56) References Cited

U.S. PATENT DOCUMENTS 11,043,602 B2    6/2021   Sasaki et al.
2016/0042949 A1  2/2016   Sasaki et al.
(Continued)

FOREIGN PATENT DOCUMENTS

CN    109075214 A    12/2018
JP    2010-192555 A   9/2010
(Continued)

OTHER PUBLICATIONS

International Search Report dated May 14, 2019 issued in PCT/JP2019/007029.
(Continued)

*Primary Examiner* — Monica D Harrison
(74) *Attorney, Agent, or Firm* — Scully, Scott, Murphy & Presser, PC

(57) ABSTRACT

A trench MOS Schottky diode includes a first semiconductor layer including a $Ga_2O_3$-based single crystal, a second semiconductor layer that is a layer stacked on the first semiconductor layer, includes a $Ga_2O_3$-based single crystal, and includes a trench opened on a surface thereof opposite to the first semiconductor layer, an anode electrode formed on the surface of the second semiconductor layer, a cathode electrode formed on a surface of the first semiconductor layer, an insulating film covering the inner surface of the trench of the second semiconductor layer, and a trench
(Continued)

electrode that is buried in the trench of the second semiconductor layer so as to be covered with the insulating film and is in contact with the anode electrode. The second semiconductor layer includes an insulating dry-etching-damaged layer with a thickness of not more than 0.8 μm in a region including the inner surface of the trench.

9 Claims, 7 Drawing Sheets

(51) Int. Cl.
    *H01L 21/311*     (2006.01)
    *H01L 29/47*     (2006.01)
    *H01L 29/66*     (2006.01)

(58) Field of Classification Search
    CPC .......... H01L 29/6614; H01L 29/66143; H01L 29/87; H01L 29/872; H01L 21/31; H01L 21/311; H01L 21/3111; H01L 21/31116
    USPC .......................................................... 257/77
    See application file for complete search history.

(56) References Cited

U.S. PATENT DOCUMENTS

| | | |
|---|---|---|
| 2017/0301789 A1 | 10/2017 | Takei et al. |
| 2019/0148563 A1 | 5/2019 | Sasaki et al. |
| 2019/0363197 A1* | 11/2019 | Sasaki ............... H01L 21/02057 |
| 2021/0151611 A1 | 5/2021 | Sasaki et al. |

FOREIGN PATENT DOCUMENTS

| | | |
|---|---|---|
| JP | 2016-025256 A | 2/2016 |
| JP | 2016-039194 A | 3/2016 |
| JP | 2019-16680 A | 1/2019 |
| WO | 2008/108299 A1 | 9/2008 |
| WO | WO 2017/188105 A1 | 11/2017 |
| WO | 2018/159350 A1 | 9/2018 |

OTHER PUBLICATIONS

Translation of International Preliminary Report on Patentability and Written Opinion dated Sep. 10, 2020 issued in PCT/JP2019/007029.
Extended European Search Report dated Oct. 18, 2021 from related EP 19761259.1.
Sasaki. Kohei, et al: "First Demonstration 1-10 of Ga2O3 Trench NOS—Type Schottky Barrier Diodes", IEEE Electron Device Letters, Jun. 1, 2017 (Jun. 1, 2017), pp. 783-785, vol. 38, No. 6, IEEE, USA, XP011649879.
Yang, Jianchen, et al: "Annealing of dry 1-10 etch damage in metallized and bare (−201) Ga2O3", Journal of Vacuum Science & Technology B: Microelectronics and Nanometer Structures, Jul. 25, 2017 (Jul. 25, 2017), pp. 1-5, vol. 35, No. 5, American Institute of Physics, 2 Huntington Quadrangle, Melville, NY 11747, XP012220360.
Notice of Reasons for Refusal dated Oct. 12, 2021 received from the Japanese Patent Office in related application 2018-036901 together with English language translation.
Office Action dated May 26, 2022 received from the Taiwanese Patent Office in related application 108106627 together with English language translation.

* cited by examiner

TRENCH MOS SCHOTTKY DIODE AND METHOD FOR PRODUCING SAME

TECHNICAL FIELD

The invention relates to a trench MOS Schottky diode and a method for producing the same.

BACKGROUND ART

A trench MOS Schottky diode is known as a type of conventional Schottky diodes (see e.g. Patent Literature 1).

Due to its trench MOS structure, the trench MOS Schottky barrier diode can have a high withstand voltage without an increase in resistance of the semiconductor layer.

CITATION LIST

Patent Literature

Patent Literature 1: WO 2017/188105 A1

SUMMARY OF INVENTION

Technical Problem

In the trench MOS Schottky barrier diode, a layer of the semiconductor layer having trenches has a narrowed current path due to the presence of the trenches and the electrical resistivity thereof is expected to be n times that of a layer without the trenches when the area of the current path is reduced to 1/n by the trenches. However, the present inventors have confirmed that in case of $Ga_2O_3$-based trench MOS Schottky barrier diodes, the electrical resistivity of the layer in which the area of the current path is reduced to 1/n by the trenches is actually far higher than n times the electrical resistivity of the layer not having the trenches. The $Ga_2O_3$-based trench MOS Schottky barrier diodes thus have a problem that the value of on-resistance is significantly larger than the expected value.

It is an object of the invention to provide a trench MOS Schottky diode which is a MOS Schottky diode formed of a $Ga_2O_3$-based crystal and in which an unusual increase in the on-resistance due to the trench MOS structure is suppressed, and a method for producing the same.

Solution to Problem

To achieve the above-mentioned object, an aspect of the invention provides a trench MOS Schottky diode defined by [1] to [5] below and a method for producing a trench MOS Schottky diode defined by [6] to [10] below.

[1] A trench MOS Schottky diode, comprising: a first semiconductor layer comprising a $Ga_2O_3$-based single crystal; a second semiconductor layer that is a layer stacked on the first semiconductor layer, comprises a $Ga_2O_3$-based single crystal, and comprises a trench opened on a surface thereof opposite to the first semiconductor layer; an anode electrode formed on the surface of the second semiconductor layer opposite to the first semiconductor layer; a cathode electrode formed on a surface of the first semiconductor layer opposite to the second semiconductor layer; an insulating film covering the inner surface of the trench of the second semiconductor layer; and a trench electrode that is buried in the trench of the second semiconductor layer so as to be covered with the insulating film and is in contact with the anode electrode, wherein the second semiconductor layer comprises an insulating dry-etching-damaged layer with a thickness of not more than 0.8 µm in a region including the inner surface of the trench.

[2] The trench MOS Schottky diode according to [1], wherein the dry-etching-damaged layer has a thickness of not more than 0.5 µm.

[3] The trench MOS Schottky diode according to [1] or [2], wherein a principal plane of the second semiconductor layer comprises a plane parallel to a b-axis, and the trench has a linear plane pattern orthogonal to a [010] direction.

[4] A trench MOS Schottky diode, comprising: a first semiconductor layer comprising a $Ga_2O_3$-based single crystal; a second semiconductor layer that is a layer stacked on the first semiconductor layer, comprises a $Ga_2O_3$-based single crystal, and comprises a trench opened on a surface thereof opposite to the first semiconductor layer; an anode electrode formed on the surface of the second semiconductor layer opposite to the first semiconductor layer; a cathode electrode formed on a surface of the first semiconductor layer opposite to the second semiconductor layer; an insulating film covering the inner surface of the trench of the second semiconductor layer; and a trench electrode that is buried in the trench of the second semiconductor layer so as to be covered with the insulating film and is in contact with the anode electrode, wherein the second semiconductor layer comprises no dry etching damage.

[5] The trench MOS Schottky diode according to [4], wherein a principal plane of the second semiconductor layer comprises a plane parallel to a b-axis, and the trench has a linear plane pattern parallel to a [010] direction.

[6] A method for producing a trench MOS Schottky diode; comprising: preparing a stacked body that comprises a first semiconductor layer comprising a $Ga_2O_3$-based single crystal and a second semiconductor layer comprising a $Ga_2O_3$-based single crystal; forming a trench on the second semiconductor layer by dry etching so as to be opened on a surface opposite to the first semiconductor layer; performing annealing treatment to reduce the thickness of an insulating dry-etching-damaged layer that is formed in the second semiconductor layer in a region including the inner surface of the trench; forming an insulating film so as to cover the inner surface of the trench of the second semiconductor layer; burying a trench electrode in the trench of the second semiconductor layer so as to be covered with the insulating film; forming an anode electrode on the surface of the second semiconductor layer opposite to the first semiconductor layer so as to be in contact with the trench electrode; and forming a cathode electrode on a surface of the first semiconductor layer opposite to the second semiconductor layer.

[7] The method for producing a trench MOS Schottky diode according to [6], wherein a temperature of the annealing treatment is not less than 700° C.

[8] The method for producing a trench MOS Schottky diode according to [6] or [7], wherein a principal plane of the second semiconductor layer comprises a plane parallel to a b-axis, and the trench has a linear plane pattern orthogonal to a [010] direction.

[9] A method for producing a trench MOS Schottky diode; comprising: preparing a stacked body that comprises a first semiconductor layer comprising a $Ga_2O_3$-based single crystal and a second semiconductor layer comprising a $Ga_2O_3$-based single crystal; forming a trench on the second semiconductor layer by dry etching so as to be opened on a surface opposite to the first semiconductor layer; performing wet etching to remove an insulating dry-etching-damaged layer that is formed on the second semiconductor layer in a region including the inner surface of the trench; forming an insulating film so as to cover the inner surface of the trench of the second semiconductor layer; burying a trench electrode in the trench of the second semiconductor layer so as to be covered with the insulating film; forming an anode electrode on the surface of the second semiconductor layer opposite to the first semiconductor layer so as to be in contact with the trench electrode; and forming a cathode electrode on a surface of the first semiconductor layer opposite to the second semiconductor layer.

[10] The method for producing a trench MOS Schottky diode according to [9], wherein a principal plane of the second semiconductor layer comprises a plane parallel to a b-axis, and the trench has a linear plane pattern parallel to a [010] direction.

Advantageous Effects of Invention

According to the invention, it is possible to provide a trench MOS Schottky diode which is a MOS Schottky diode formed of a $Ga_2O_3$-based crystal and in which an unusual increase in the on-resistance due to the trench MOS structure is suppressed, and the method for producing the same.

DESCRIPTION OF EMBODIMENTS

Embodiment (Configuration of Trench MOS Schottky Diode)

Figure 1:
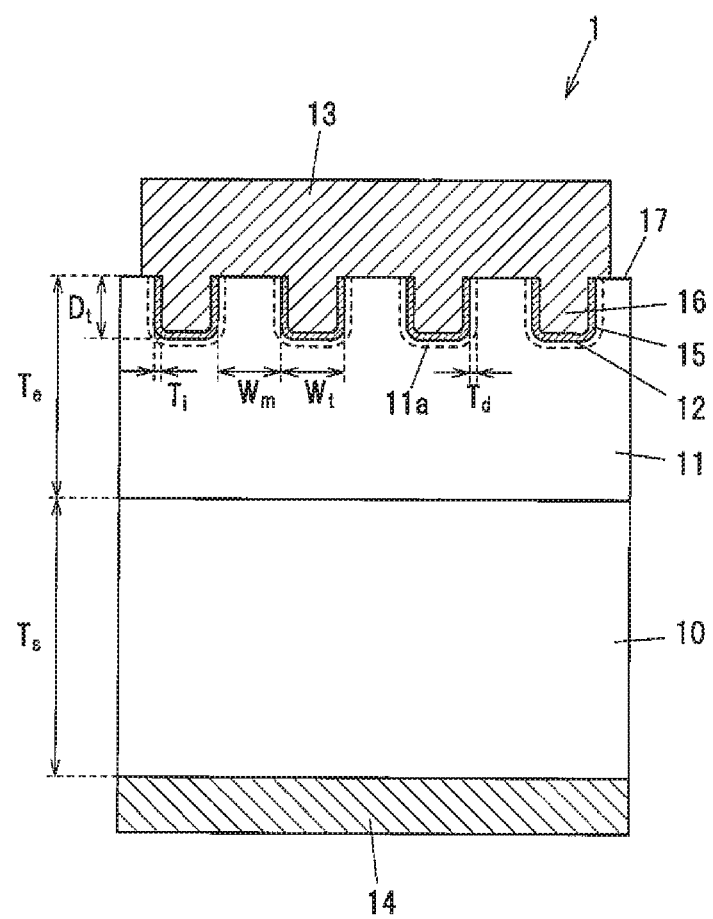
FIG. 1 is a vertical cross-sectional view showing a trench MOS Schottky diode in an embodiment.

FIG. 1 is a vertical cross-sectional view showing a trench MOS Schottky diode 1 in an embodiment. The trench MOS Schottky diode 1 is a vertical $Ga_2O_3$-based Schottky diode having a trench MOS region.

The trench MOS Schottky diode 1 has a first semiconductor layer 10, a second semiconductor layer 11 which is a layer stacked on the first semiconductor layer 10 and has trenches 12 opened on a surface 17 thereof opposite to the first semiconductor layer 10, an anode electrode 13 formed on the surface 17 of the second semiconductor layer 11, a cathode electrode 14 formed on a surface of the first semiconductor layer 10 opposite to the second semiconductor layer 11, insulating films 15 covering inner surfaces of the trenches 12 of the second semiconductor layer 11, and trench electrodes 16 which are buried in the trenches 12 of the second semiconductor layer 11 so as to be covered with the insulating films 15 and are in contact with the anode electrode 13.

In the trench MOS Schottky diode 1, an energy barrier at an interface between the anode electrode 13 and the second semiconductor layer 11 as viewed from the second semiconductor layer 11 is lowered by applying a forward voltage (i.e., positive potential on the anode electrode 13 side) between the anode electrode 13 and the cathode electrode 14, allowing a current flow from the anode electrode 13 to the cathode electrode 14.

On the other hand, when a reverse voltage (i.e., negative potential on the anode electrode 13 side) is applied between the anode electrode 13 and the cathode electrode 14, no current flow occurs due to the Schottky barrier. When the reverse voltage is applied between the anode electrode 13 and the cathode electrode 14, depletion layers spread from the interface between the anode electrode 13 and the second semiconductor layer 11, and the interface between the insulating films 15 and the second semiconductor layer 11.

In general, the upper limit of a reverse leakage current in Schottky diodes is set to be 1 µA. In this embodiment, a reverse voltage when a leakage current of 1 µA flows is defined as a withstand voltage.

The trench MOS Schottky diode 1 in this embodiment has a trench MOS structure and, therefore, can have a high withstand voltage without increasing the resistance of the semiconductor layer. In other words, the trench MOS Schottky diode 1 is a Schottky diode with a high withstand voltage and a low loss.

The first semiconductor layer 10 is formed of an n-type $Ga_2O_3$-based single crystal containing a Group IV element such as Si, Sn as a donor. The donor concentration $N_d'$ of the first semiconductor layer 10 is, e.g., not less than $1.0 \times 10^{18}$ and not more than $1.0 \times 10^{20}$ $Cm^{-3}$. The thickness $T_s$ of the first semiconductor layer 10 is, e.g., 10 to 600 µm. The first semiconductor layer 10 is, e.g., a $Ga_2O_3$-based single crystal substrate.

Here, the $Ga_2O_3$-based single crystal is a $Ga_2O_3$ single crystal, or is a $Ga_2O_3$ single crystal doped with an element such as Al, In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In. The band gap is widened by adding Al and is narrowed by adding In. The $Ga_2O_3$ single crystal mentioned above has, e.g., a β-crystal structure.

The second semiconductor layer 11 is formed of an n-type $Ga_2O_3$-based single crystal containing a Group IV element such as Si, Sn as a donor. A donor concentration $N_d$ of the second semiconductor layer 11 is lower than the donor concentration $N_d'$ of the first semiconductor layer 10. The second semiconductor layer 11 is, e.g., an epitaxial layer epitaxially grown on the first semiconductor layer 10 which is a $Ga_2O_3$-based single crystal substrate.

A high-donor-concentration layer containing a high concentration of donor may be formed between the first semiconductor layer 10 and the second semiconductor layer 11. The high-donor-concentration layer is used when, e.g., the second semiconductor layer 11 is epitaxially grown on the first semiconductor layer 10 as a substrate. At the early growth stage of the second semiconductor layer 11, the amount of dopant incorporated thereinto is unstable and an acceptor impurity is diffused from the first semiconductor layer 10 as a substrate. Thus, a region of the second semiconductor layer 11 close to the interface with the first semiconductor layer 10 may have a high resistance when the second semiconductor layer 11 is grown directly on the first semiconductor layer 10. The high-donor-concentration layer is used to avoid the problem. The concentration in the high-donor-concentration layer is set to be, e.g., higher than the concentration in the second semiconductor layer 11, more preferably, higher than the concentration in the first semiconductor layer 10.

As the donor concentration in the second semiconductor layer 11 increases, electrical field strength in each part of the trench MOS Schottky barrier diode 1 increases. The donor concentration in the second semiconductor layer 11 is preferably not more than about $1.0 \times 10^{17}$ cm$^{-3}$ to lower the maximum electric field strength in a region of the second semiconductor layer 11 immediately under the anode electrode 13, the maximum electric field strength in the second semiconductor layer 11 and the maximum electric field strength in the insulating film 15. On the other hand, as the donor concentration decreases, the resistance of the second semiconductor layer 11 increases and the forward loss increases. Therefore, to ensure a withstand voltage of, e.g., not more than 1200V, not less than $3.0 \times 10^{16}$ cm$^{-3}$ is preferable. Furthermore, to obtain a higher withstand voltage, the donor concentration may be reduced to, e.g., about $1.0 \times 10^{16}$ cm$^{-3}$.

As the thickness $T_e$ of the second semiconductor layer 11 increases, the maximum electric field strength in the second semiconductor layer 11 and the maximum electric field strength in the insulating film 15 decrease. By setting the thickness $T_e$ of the second semiconductor layer 11 to be about not less than 3 µm, it is possible to effectively reduce the maximum electric field strength in the second semiconductor layer 11 and the maximum electric field strength in the insulating film 15. In terms of reduction in these maximum electric field strengths and downsizing of the trench MOS Schottky barrier diode 1, the thickness $T_e$ of the second semiconductor layer 11 is preferably about not less than 3 µm and not more than 9 µm.

Electrical field strength in each part of the trench MOS Schottky barrier diode 1 changes depending on a depth $D_t$ of the trench 12. The depth $D_t$ of the trench 12 is preferably about not less than 1.5 µm and not more than 6 µm to lower the maximum electric field strength in a region of the second semiconductor layer 11 immediately under the anode electrode 13, the maximum electric field strength in the second semiconductor layer 11 and the maximum electric field strength in the insulating film 15.

As the width $W_t$ of the trench 12 is narrowed, the conduction loss can be reduced but the production becomes difficult so as to cause a decrease in production yield. Therefore, not less than 0.3 µm and not more than 5 µm is preferable.

As the width $W_m$ of a mesa-shaped portion between adjacent trenches 12 on the second semiconductor layer 11 decreases, the maximum electric field strength in a region of the second semiconductor layer 11 immediately under the anode electrode 13 decreases. The width $W_m$ of the mesa-shaped portion is preferably not more than 4 µm to lower the maximum electric field strength in a region of the second semiconductor layer 11 immediately under the anode electrode 13. At the same time, the width $W_m$ of the mesa-shaped portion is preferably not less than 0.25 µm since the production of the trench 12 becomes difficult as the width of the mesa-shaped portion is reduced.

Since the maximum electric field strength in the insulating film 15 decreases as the permittivity of the insulating film 15 increases, the insulating film 15 is preferably formed of a high-permittivity material. For example, $Al_2O_3$ (which has a relative permittivity of about 9.3) and $HfO_2$ (which has a relative permittivity of about 22) can be used as a material of the insulating film 15, and it is particularly preferable to use $HfO_2$ which has a high permittivity.

Also, as the thickness $T_i$ of the insulating film 15 increases, the maximum electric field strength in the second semiconductor layer 11 decreases but the maximum electric field strength in the insulating film 15 and the maximum electric field strength in a region immediately under the anode electrode 13 are increased. In terms of easiness in production, the thickness of the insulating film 15 is preferably reduced, and is more preferably not more than 300 nm. However, it obviously needs such a thickness that almost no direct current flow occurs between the trench electrode 16 and the second semiconductor layer 11.

The material of the trench electrode 16 is not specifically limited if it is electrically conductive, and it is possible to use, e.g., polycrystalline Si doped at a high concentration and a metal such as Ni, Au.

As described above, the electric field strength in the trench MOS Schottky diode 1 is affected by the width of the mesa-shaped portion between two adjacent trenches 12, the depth $D_t$ of the trench 12 and the thickness $T_i$ of the insulating film 15 etc. but is hardly affected by a plane pattern of the trenches 12. Thus, the plane pattern of the trenches 12 on the second semiconductor layer 11 is not specifically limited.

Figure 2:
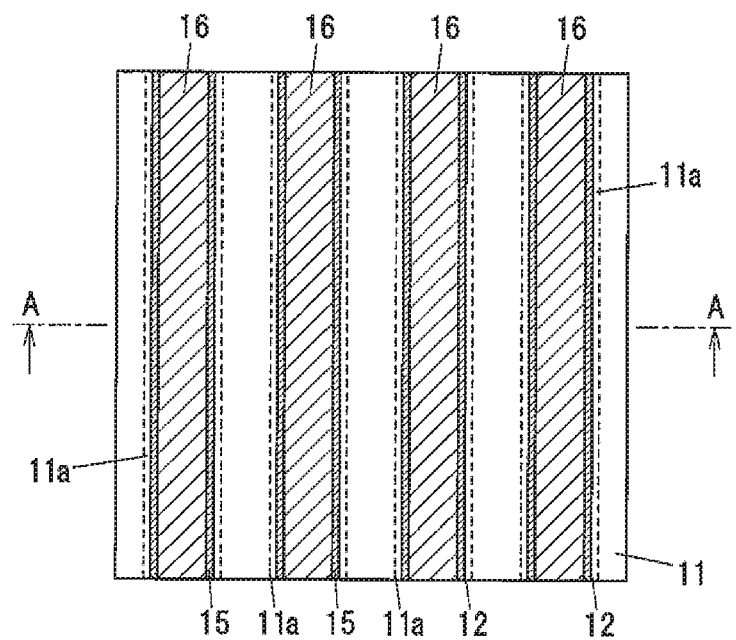
FIG. 2 is a horizontal cross-sectional view of the trench MOS Schottky diode, showing a typical example of a plane pattern of trenches.

FIG. 2 is a horizontal cross-sectional view of the trench MOS Schottky diode 1, showing a typical example of a plane pattern of the trench 12.

The trenches 12 shown in FIG. 2 are formed in a linear plane pattern. The cross section of the trench MOS Schottky diode 1 shown in FIG. 1 corresponds to a cross section when the trench MOS Schottky diode 1 shown in FIG. 2 is cut along line A-A.

The anode electrode 13 is in Schottky contact with the second semiconductor layer 11. The anode electrode 13 is formed of Pt, Pd, Au, Ni, Ag, Cu, Al, Mo, W, In, Ti or polycrystalline Si, or oxides, nitrides or alloys thereof etc. A reverse leakage current at a Schottky interface between the anode electrode 13 and the second semiconductor layer 11 is smaller when a height (i.e., barrier height) of a barrier at the interface between the anode electrode 13 and the second semiconductor layer 11 is higher. Meanwhile, when a metal with a high barrier height is used to form the anode electrode 13, forward rising voltage increases and the forward loss thus increases. Therefore, it is preferable to select a material having a barrier height so that the reverse leakage current is about 1 µA at a maximum. When reverse withstand voltage is, e.g., 600V to 1200V, it is possible to maximize reduction of forward loss by adjusting the barrier height to about 0.7 eV while keeping the reverse leakage current down to about 1 µA.

The anode electrode 13 may have a multilayer structure formed by stacking different metal films, e.g., Cu/Ni/Al, Pt/Au, Pt/Al, Pd/Au, Pd/Al, Pt/Ti/Au or Pt/Ti/Au. The anode electrode 13 may be formed integrally with the trench electrodes 16. In this case, the anode electrode 13 and the trench electrodes 16 may have the above-mentioned multilayer structure formed by stacking different metal.

The cathode electrode 14 is in ohmic contact with the first semiconductor layer 10. The cathode electrode 14 is formed of a metal such as Ti. The cathode electrode 14 may have a multilayer structure formed by stacking different metal films, e.g., Ti/Ni/Au, Ti/Au or Ti/Al. For reliable ohmic contact between the cathode electrode 14 and the first semiconductor layer 10, the cathode electrode 14 is preferably configured that a layer in contact with the first semiconductor layer 10 is formed of Ti.

As mentioned previously, the present inventors found that in case of $Ga_2O_3$-based trench MOS Schottky barrier diodes, the electrical resistivity of the layer in which the area of the current path is reduced to 1/n by the trenches is far higher than n times the electrical resistivity of the layer not having the trenches. That is, in the trench MOS Schottky diode 1, the electrical resistivity of the layer of the second semiconductor layer 11 in which the area of the current path is reduced to 1/n by the trenches 12 is far higher than n times the electrical resistivity of the layer of the second semiconductor layer 11 not having the trenches, unless being specifically treated.

Also, as a result of intensive study, the present inventors found that the main cause is that dry-etching-damaged layers 11a, which are layers damaged by dry etching during formation of the trenches 12, have insulating properties and narrow the current path. In other words, in a layer of the second semiconductor layer 11 with the trenches 12, the current path is narrowed by the trenches 12 as well as the dry-etching-damaged layers 11a formed in a region including the inner surfaces of the trenches 12.

In the trench MOS Schottky diode 1, the dry-etching-damaged layers 11a of the second semiconductor layer 11 are subjected to annealing treatment and are thereby reduced in thickness as compared to immediately after its formation. Since the dry-etching-damaged layer 11a has smaller damage in a portion farther from the inner surface of the trench 12, the dry-etching-damaged layer 11a becomes thinner as the damage recovery progresses.

The thickness $T_d$ of the annealed dry-etching-damaged layers 11a is not more than 1.0 μm, and can be, e.g., not more than 0.8 μm when desired to effectively reduce the thickness of the dry-etching-damaged layers 11a even at the cost of evaporation of the $Ga_2O_3$-based single crystal. However, when desired to reduce degradation of the device characteristics of the trench MOS Schottky diode 1 due to evaporation of the $Ga_2O_3$-based single crystal, the thickness $T_d$ is preferably not less than 0.1 μm.

The dry-etching-damaged layers 11a may be removed by wet etching. When using wet etching, it is possible to substantially completely remove the dry-etching-damaged layers 11a even though it may result in that the trenches 12 have an unintended shape which depends on the facet of the $Ga_2O_3$-based single crystal. In this case, the second semiconductor layer 11 does not include dry etching damage.

However, since the etching rate of wet etching drastically decreases depending on the crystal orientation of the second semiconductor layer 11, removal of the dry-etching-damaged layers 11a by wet etching cannot be performed. It has been confirmed that, e.g., removal of the dry-etching-damaged layers 11a by wet etching can be performed when the principal plane of the second semiconductor layer 11 is a plane parallel to a b-axis such as (001) plane and the trenches 12 have a linear plane pattern parallel to a [010] direction, but removal of the dry-etching-damaged layers 11a by wet etching cannot be performed when the principal plane of the second semiconductor layer 11 is a plane parallel to the b-axis such as (001) plane and the trenches 12 have a linear plane pattern orthogonal to the [010] direction.

Therefore, recovery from dry etching damage by annealing treatment is important in case that removal of the dry-etching-damaged layers 11a by wet etching cannot be performed.

(Method for Producing the Trench MOS Schottky Diode)

An example of a method for producing the trench MOS Schottky diode 1 will be described below.

FIGS. 3A to 3C, 4A and 4B are vertical cross-sectional views showing a process of producing the trench MOS Schottky diode 1 in the embodiment.

Figure 3A:
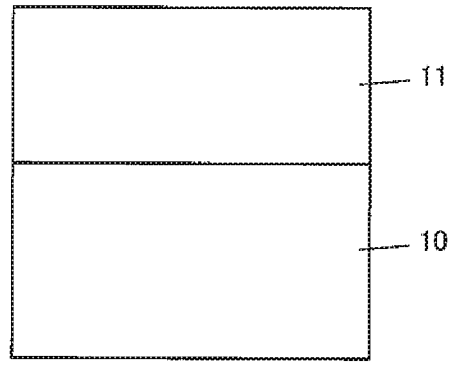
FIG. 3A is a vertical cross-sectional view showing a process of producing the trench MOS Schottky diode in the embodiment.

Firstly, as shown in FIG. 3A, a $Ga_2O_3$-based single crystal is epitaxially grown on the first semiconductor layer 10 such as a $Ga_2O_3$-based single crystal substrate by the HYPE (Hydride Vapor Phase Epitaxy) method, etc., thereby forming the second semiconductor layer 11.

Figure 3B:
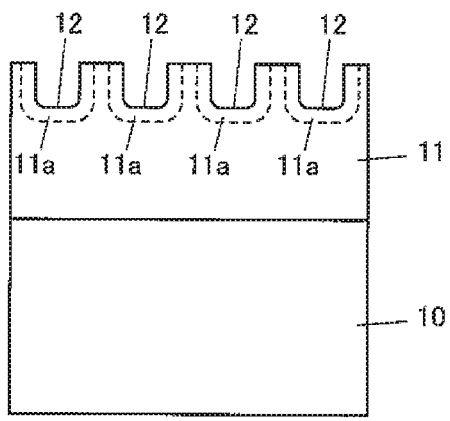
FIG. 3B is a vertical cross-sectional view showing the process of producing the trench MOS Schottky diode in the embodiment.

Next, as shown in FIG. 3B, the trenches 12 are formed on the upper surface of the second semiconductor layer 11 by photolithography and dry etching. At this time, due to damage caused by dry etching, the insulating dry-etching-damaged layers 11a with a thickness of about 1.4 μm are formed in the second semiconductor layer 11 in a region including the inner surfaces of the trenches 12.

The preferable conditions of the dry etching are, e.g., use of $BCl_3$ (30 sccm) as an etching gas, pressure of 1.0 Pa, antenna power of 160 W, bias power of 17 W, and duration of 90 minutes.

Figure 3C:
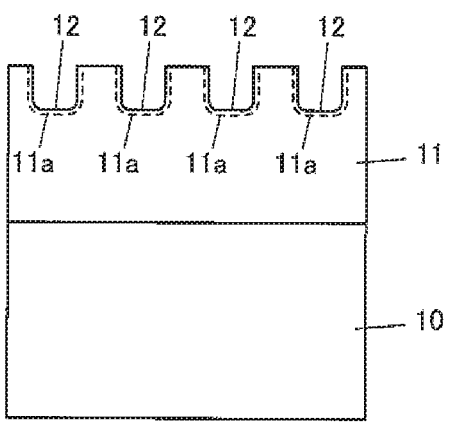
FIG. 3C is a vertical cross-sectional view showing the process of producing the trench MOS Schottky diode in the embodiment.

Next, as shown in FIG. 3C, the dry-etching-damaged layers 11a are reduced in thickness by annealing treatment. The temperature of the annealing treatment is not less than 400° C., and can be, e.g., about not less than 700° C. when desired to effectively reduce the thickness of the dry-etching-damaged layer 11a even at the cost of evaporation of the $Ga_2O_3$-based single crystal. However, when desired to reduce degradation of the device characteristics of the trench MOS Schottky diode 1 due to evaporation of the $Ga_2O_3$-based single crystal, the temperature of the annealing treatment is preferably not more than 1150° C. The duration of the annealing treatment is, e.g., 1 to 60 minutes.

Instead of reducing the thickness of the dry-etching-damaged layers 11a by annealing treatment, the dry-etching-damaged layers 11a may be removed by wet etching. The wet etching conditions are, e.g., use of phosphoric acid as an etchant, 120 to 130° C., and 15 minutes. Alternatively, a combination of the annealing treatment with the wet etching process may be used. In this case, the dry-etching-damaged layers 11a are reduced in thickness and then removed. Therefore, it is possible to reduce the amount removed by wet etching, thereby obtaining the trenches 12 close to the desired shape.

Figure 4A:
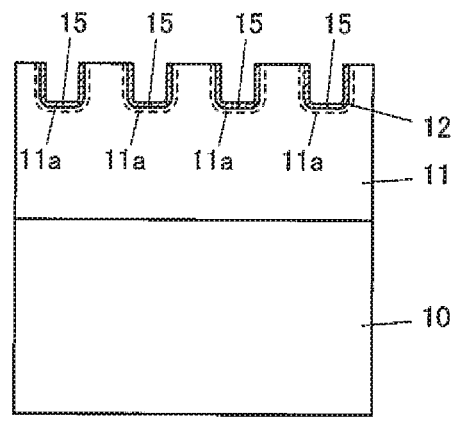
FIG. 4A is a vertical cross-sectional view showing the process of producing the trench MOS Schottky diode in the embodiment.

Next, as shown in FIG. 4A, the insulating films 15 are formed. Firstly, the insulating film 15 made of $HfO_2$, etc., is formed on the upper surface of the second semiconductor layer 11 by the ALD (Atomic Layer Deposition) method, etc., so that the inner surfaces of the trenches 12 are covered. The conditions for $HfO_2$ film formation are not specifically limited, and the film is formed by, e.g., alternately supplying TDMAH as an Hf raw material for 0.25 seconds and $O_3$ as an oxidizing agent for 0.15 seconds. The substrate temperature at this time is 250° C.

Next, part of the insulating film 15 outside the trenches 12 (portions located on the mesa-shaped portions between the trenches 12) is removed by a planarization process such as CMP (Chemical Mechanical Polishing).

Figure 4B:
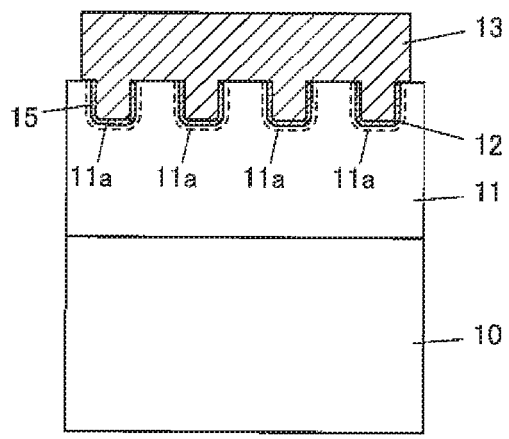
FIG. 4B is a vertical cross-sectional view showing the process of producing the trench MOS Schottky diode in the embodiment.

Next, as shown in FIG. 4B, the anode electrode 13 is formed. Firstly, the trench electrodes 16 and the anode electrode 13 are formed continuously and integrally by electron beam evaporation, etc.

Before depositing the trench electrodes 16 and the anode electrode 13, treatment with a sulfuric acid/hydrogen peroxide mixture is performed to remove CMP abrasive, etc. When a treatment solution other than the sulfuric acid/hydrogen peroxide mixture, such as hydrochloric acid, nitric acid, sulfuric acid, hydrofluoric acid or buffered hydrofluoric acid, is used, treatment with the sulfuric acid/hydrogen peroxide mixture or hydrogen peroxide solution is performed after treatment with such solution to prevent the turn-on voltage from being fixed to about 0.8 to 1.0V.

Next, the anode electrode 13 is patterned into a predetermined shape such as circle by photo etching, etc.

After that, the cathode electrode 14 is formed on the bottom surface of the first semiconductor layer 10 by electron beam evaporation, etc., thereby obtaining the trench MOS Schottky diode 1.

Effects of the Embodiment

In the embodiment, since the insulating dry-etching-damaged layers 11a are reduced in thickness by annealing treatment or removed by wet etching, it is possible to suppress an unusual increase in the on-resistance of the trench MOS Schottky diode 1 which is formed of a $Ga_2O_3$-based crystal.

Example 1

The effect of reducing the thickness of the dry-etching-damaged layer 11a by annealing treatment was assessed by experiments.

Figure 5:
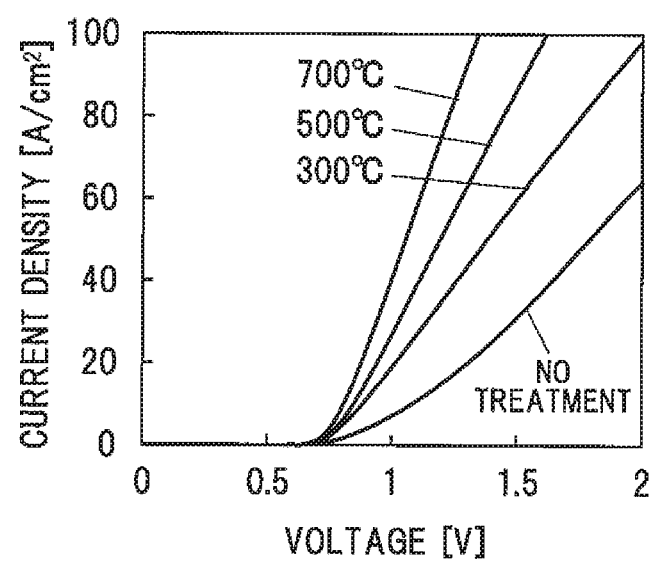
FIG. 5 is a graph showing current-voltage characteristics of the trench MOS Schottky diodes in Example.

FIG. 5 is a graph showing current-voltage characteristics of the trench MOS Schottky diode 1. FIG. 5 shows the current-voltage characteristics of the trench MOS Schottky diode 1 configured so that the width $W_m$ of the mesa-shaped portion between the trenches 12, the width $W_t$ of the trench 12 and the depth $D_t$ of the trench 12 are respectively about 2 μm, 4 μm and 3 μm.

In FIG. 5, "no treatment" shows the characteristics when the annealing treatment is not performed, and "300° C.", "500° C." and "700° C." show the characteristics after performing the annealing treatment at the respective temperatures.

FIG. 5 shows that the on-resistance is reduced by performing the annealing treatment, and the on-resistance decreases as the annealing treatment temperature increases. It is considered that this is because the insulating dry-etching-damaged layers 11a were reduced in thickness by the annealing treatment and the current path in the layer of the second semiconductor layer 11 with the trenches 12 was widened.

Next, a relation between the annealing treatment temperature and the thickness $T_d$ of the dry-etching-damaged layer 11a was obtained by calculation based on the experiments and the experimental values. The method for deriving the thickness $T_d$ of the dry-etching-damaged layer 11a will be described below.

Firstly, as shown by the equation 1 below, an electrical resistance R between the anode electrode 13 and the cathode electrode 14 in the trench MOS Schottky diode 1 is expressed by the total of an electrical resistance $R_s$ of the first semiconductor layer 10, an electrical resistance $R_e$ of the layer of the second semiconductor layer 11 without the trenches 12, and an electrical resistance $R_t$ of the layer of the second semiconductor layer 11 with the trenches 12.

$$R = R_s + R_e + R_t \qquad \text{(Equation 1)}$$

The electrical resistance $R_s$ of the first semiconductor layer 10 is expressed by the equation 2 below, where q is an elementary charge ($1.6 \times 10^{-19}$C), $\mu_s$ is an electron mobility in the first semiconductor layer 10, and $N_s$ is a donor concentration in the first semiconductor layer 10.

$$R_S = \frac{1}{q\mu_s N_s} * T_s \qquad \text{(Equation 2)}$$

The electrical resistance $R_e$ of the layer of the second semiconductor layer 11 without the trenches 12 is expressed by the equation 3 below, where $\mu_e$ is an electron mobility in the second semiconductor layer 11, and $N_e$ is a donor concentration in the second semiconductor layer 11.

$$R_e = \frac{1}{q\mu_e N_e} * (T_e - D_t) \qquad \text{(Equation 3)}$$

The electrical resistance $R_t$ of the layer of the second semiconductor layer 11 with the trenches 12 can be obtained from the actually measured value of the electrical resistance R between the anode electrode 13 and the cathode electrode 14, and the equations 1 to 3.

Figure 6A:
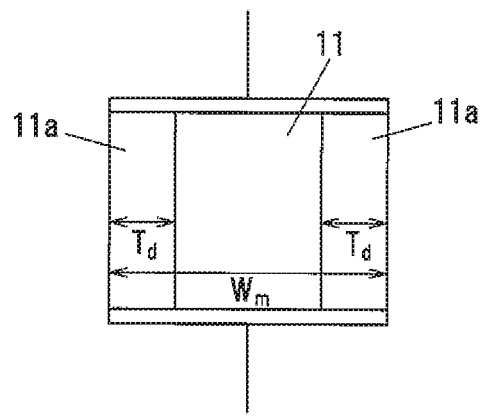
FIG. 6A shows a structural model used for calculating the thickness of the dry-etching-damaged layer.
Figure 6B:
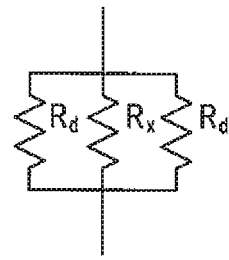
FIG. 6B shows a circuit of the structural model in FIG. 6A.

FIGS. 6A and 6B show a structural model used for calculating the thickness $T_d$ of the dry-etching-damaged layer 11a, and its circuit. FIG. 6A is a structural model of the mesa-shaped portion that includes the second semiconductor layer 11 (i.e., its region that the dry-etching-damaged layers 11a are not formed) and the dry-etching-damaged layers 11a and that is sandwiched by the trenches 12 on both sides thereof.

In the structural model of FIG. 6A, it can be regarded that the second semiconductor layer 11 at the middle and the dry-etching-damaged layers 11a on both sides are connected in parallel, as shown in the circuit diagram of FIG. 6B. Therefore, the electrical resistance $R_t$ of the layer of the second semiconductor layer 11 with the trenches 12 is expressed by the following equation 4, where $R_x$ is the electrical resistance of the second semiconductor layer 11 and $R_d$ is the electrical resistance of the dry-etching-damaged layer 11a.

$$R_t = \frac{R_d * R_x}{(R_d + 2R_x)} \qquad \text{(Equation 4)}$$

Here, the electrical resistance $R_d$ of the dry-etching-damaged layer 11a is expressed as the following equation 5, using the thickness $T_d$ of the dry-etching-damaged layer 11a, the width $W_m$ of the mesa-shaped portion between the trenches 12 and the width $W_t$ of the trench 12, where $N_d$ is a donor concentration in the dry-etching-damaged layer 11a.

$$R_d = \frac{1}{q\mu_e N_d} * D_t * \frac{W_m + W_t}{T_d} \qquad \text{(Equation 5)}$$

Then, the electrical resistance $R_x$ of the second semiconductor layer 11 is expressed by the following equation 6.

$$R_x = \frac{1}{q\mu_e N_e} * D_t * \frac{W_m + W_t}{W_m - 2T_d} \quad \text{(Equation 6)}$$

Given that the donor concentration $N_d$ in the dry-etching-damaged layer 11a is 1/100 of the donor concentration $N_e$ in the second semiconductor layer 11, the equation 7 for calculating the thickness $T_d$ of the dry-etching-damaged layer 11a is derived from the equations 4 to 6.

$$T_d = \frac{50}{99}\left\{W_m - \frac{D_t(W_m + W_T)}{q\mu_e N_e R_t}\right\} \quad \text{(Equation 7)}$$

Table 1 below shows the parameters of each portion in five types of the trench MOS Schottky diodes 1 (Samples A to E) treated at different annealing temperatures, which are used for measurement and calculation in this Example, and the calculated values of $R_s$, $R_e$, $R_t$ and $T_d$.

TABLE 1

|  | Sample A | Sample B | Sample C | Sample D | Sample E |
| --- | --- | --- | --- | --- | --- |
| Annealing treatment temperature [° C.] | 0 | 300 | 500 | 700 | 900 |
| $\mu_s$ [cm²/V · s] | 87 | 87 | 87 | 87 | 87 |
| $\mu_e$ [cm²/V · s] | 111 | 111 | 111 | 111 | 111 |
| $N_s$ [/cm³] | 1.00 × 10¹⁸ | 1.00 × 10¹⁸ | 1.00 × 10¹⁸ | 1.00 × 10¹⁸ | 1.00 × 10¹⁸ |
| $N_e$ [/cm³] | 4.0 × 10¹⁶ | 3.2 × 10¹⁶ | 3.4 × 10¹⁶ | 3.2 × 10¹⁶ | 2.5 × 10¹⁶ |
| $T_s$ [μm] | 250 | 250 | 250 | 250 | 250 |
| $T_e$ [μm] | 7 | 7 | 7 | 7 | 7 |
| $D_t$ [μm] | 3.3 | 2.62 | 3.3 | 2.62 | 2.92 |
| $W_m$ [μm] | 2.33 | 2.4 | 2.23 | 2.33 | 1.86 |
| $W_t$ [μm] | 3.67 | 3.6 | 3.77 | 3.67 | 4.14 |
| R [mΩ · cm²] | 15.2 | 12.5 | 8.6 | 5.9 | 7.0 |
| $R_s$ [mΩ · cm²] | 1.80 | 1.80 | 1.80 | 1.80 | 1.80 |
| $R_e$ [mΩ · cm²] | 0.52 | 0.77 | 0.61 | 0.77 | 0.92 |
| $R_t$ [mΩ · cm²] | 12.9 | 9.9 | 6.2 | 3.4 | 4.2 |
| $T_d$ [μm] | 1.07 | 1.07 | 0.86 | 0.76 | 0.47 |

Figure 7:
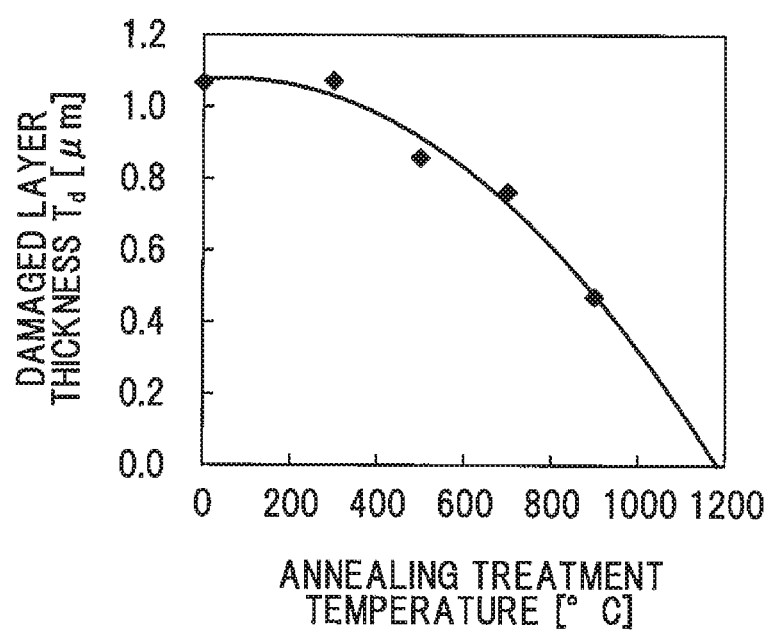
FIG. 7 is a graph in which a relation between the thickness of the dry-etching-damaged layer and annealing treatment temperature in Table 1 is plotted.

FIG. 7 is a graph in which a relation between the thickness $T_d$ of the dry-etching-damaged layer 11a and the annealing treatment temperature in Table 1 is plotted.

FIG. 7 shows that the thickness $T_d$ of the dry-etching-damaged layer 11a starts to decrease at the annealing treatment temperature of around 400° C. or more, and becomes substantially zero at about 1170° C.

Meanwhile, the higher the annealing treatment temperature, the larger the evaporated amount of the Ga₂O₃-based single crystal constituting the second semiconductor layer 11, etc. In particular, the Ga₂O₃-based single crystal starts to evaporate at the annealing treatment temperature of about not less than 700° C., the surface shape of the of the second semiconductor layer 11 starts to change due to evaporation of the Ga₂O₃-based single crystal at about not less than 900° C., and the change in the surface shape of the of the second semiconductor layer 11 increases to the extent that the device characteristics of the trench MOS Schottky diode 1 certainly degrade when more than 1150° C.

Thus, the temperature of the annealing treatment can be not less than 700° C. when desired to effectively reduce the thickness of the dry-etching-damaged layer 11a even at the cost of evaporation of the Ga₂O₃-based single crystal. However, when desired to reduce degradation of device characteristics of the trench MOS Schottky diode 1 due to evaporation of the Ga₂O₃-based single crystal, the temperature of the annealing treatment is preferably not more than 1150° C.

In more detail, when, e.g., desired to reduce the thickness of the dry-etching-damaged layer 11a with substantially no evaporation of the Ga₂O₃-based single crystal, the annealing treatment temperature can be set in the range of not less than 400° C. and less than 700° C. When desired to effectively reduce the thickness of the dry-etching-damaged layer 11a while suppressing evaporation of the Ga₂O₃-based single crystal to the extent that the surface of the second semiconductor layer 11 does not deform, the annealing treatment temperature can be set in the range of not less than 700° C. and less than 900° C. When desired to significantly reduce the thickness $T_d$ of the dry-etching-damaged layer 11a even at the cost of evaporation of the Ga₂O₃-based single crystal, the annealing treatment temperature can be set in the range of not less than 900° C. and not more than 1150° C.

Therefore, when, e.g., desired to effectively reduce the thickness of the dry-etching-damaged layer 11a even at the cost of evaporation of the Ga₂O₃-based single crystal, the thickness $T_d$ of the dry-etching-damaged layer 11a can be not more than 0.8 μm, based on the relation between the thickness of the dry-etching-damaged layer 11a and the on-resistance shown in Table 1 and FIG. 6. However, when desired to reduce degradation of the device characteristics of the trench MOS Schottky diode 1 due to evaporation of the Ga₂O₃-based single crystal, the thickness $T_d$ is preferably not less than 0.1 μm.

In more detail, when, e.g., desired to reduce the thickness of the dry-etching-damaged layer 11a with substantially no evaporation of the Ga₂O₃-based single crystal, the thickness of the dry-etching-damaged layer 11a can be in the range of more than 0.8 μm and not more than 1.0 μm. When desired to effectively reduce the thickness of the dry-etching-damaged layer 11a while suppressing evaporation of the Ga₂O₃-based single crystal to the extent that the surface of the second semiconductor layer 11 does not deform, the thickness of the dry-etching-damaged layer 11a can be in the range of more than 0.5 μm and not more than 0.8 μm. When desired to significantly reduce the thickness of the dry-etching-damaged layer 11a even at the cost of evaporation of the Ga₂O₃-based single crystal, the thickness of the dry-etching-damaged layer 11a can be in the range of not less than 0.1 μm and not more than 0.5 μm.

Although the embodiment and Example of the invention have been described, the invention is not intended to be limited to the embodiment and Example, and the various kinds of modifications can be implemented without departing from the gist of the invention.

In addition, the invention according to claims is not to be limited to the embodiment and Example described above. Further, it should be noted that all combinations of the features described in the embodiment and Example are not necessary to solve the problem of the invention.

INDUSTRIAL APPLICABILITY

Provided are a trench MOS Schottky diode which is a MOS Schottky diode formed of a Ga₂O₃-based crystal and in which an unusual increase in the on-resistance due to the trench MOS structure is suppressed, and a method for producing the same.

REFERENCE SIGNS LIST

1 TRENCH MOS SCHOTTKY DIODE
10 FIRST SEMICONDUCTOR LAYER

11 SECOND SEMICONDUCTOR LAYER
11a DRY-ETCHING-DAMAGED LAYER
12 TRENCH
13 ANODE ELECTRODE
14 CATHODE ELECTRODE
15 INSULATING FILM
16 TRENCH ELECTRODE

The invention claimed is:

1. A trench MOS Schottky diode, comprising:
a first semiconductor layer comprising a $Ga_2O_3$-based single crystal;
a second semiconductor layer that is a layer stacked on the first semiconductor layer, comprises a $Ga_2O_3$-based single crystal, and comprises a trench opened on a surface thereof opposite to the first semiconductor layer;
an anode electrode formed on the surface of the second semiconductor layer opposite to the first semiconductor layer;
a cathode electrode formed on a surface of the first semiconductor layer opposite to the second semiconductor layer;
an insulating film covering the inner surface of the trench of the second semiconductor layer; and
a trench electrode that is buried in the trench of the second semiconductor layer so as to be covered with the insulating film and is in contact with the anode electrode,
wherein the second semiconductor layer comprises an insulating dry-etching-damaged layer with a thickness of not more than 0.8 μm in a region including the inner surface of the trench, and
wherein a principal plane of the second semiconductor layer comprises a plane parallel to a b-axis, and the trench has a linear plane pattern orthogonal to a [010] direction.

2. The trench MOS Schottky diode according to claim 1, wherein the dry-etching-damaged layer has a thickness of not more than 0.5 μm.

3. The trench MOS Schottky diode according to claim 2, wherein a principal plane of the second semiconductor layer comprises a plane parallel to a b-axis, and the trench has a linear plane pattern orthogonal to a [010] direction.

4. A method for producing a trench MOS Schottky diode; comprising:
preparing a stacked body that comprises a first semiconductor layer comprising a $Ga_2O_3$-based single crystal and a second semiconductor layer comprising a $Ga_2O_3$-based single crystal;
forming a trench on the second semiconductor layer by dry etching so as to be opened on a surface opposite to the first semiconductor layer;
performing annealing treatment to reduce the thickness of an insulating dry-etching-damaged layer that is formed in the second semiconductor layer in a region including the inner surface of the trench;
forming an insulating film so as to cover the inner surface of the trench of the second semiconductor layer;
burying a trench electrode in the trench of the second semiconductor layer so as to be covered with the insulating film;
forming an anode electrode on the surface of the second semiconductor layer opposite to the first semiconductor layer so as to be in contact with the trench electrode; and
forming a cathode electrode on a surface of the first semiconductor layer opposite to the second semiconductor layer,
wherein the annealing treatment is performed after forming the trench on the second semiconductor layer by the dry etching and before forming the insulating film on the inner surface of the trench of the second semiconductor layer.

5. The method for producing a trench MOS Schottky diode according to claim 4, wherein a temperature of the annealing treatment is not less than 700° C.

6. The method for producing a trench MOS Schottky diode according to claim 5, wherein a principal plane of the second semiconductor layer comprises a plane parallel to a b-axis, and the trench has a linear plane pattern orthogonal to a [010] direction.

7. The method for producing a trench MOS Schottky diode according to claim 4, wherein a principal plane of the second semiconductor layer comprises a plane parallel to a b-axis, and the trench has a linear plane pattern orthogonal to a [010] direction.

8. A method for producing a trench MOS Schottky diode; comprising:
preparing a stacked body that comprises a first semiconductor layer comprising a $Ga_2O_3$-based single crystal and a second semiconductor layer comprising a $Ga_2O_3$-based single crystal;
forming a trench on the second semiconductor layer by dry etching so as to be opened on a surface opposite to the first semiconductor layer;
performing wet etching to remove an insulating dry-etching-damaged layer that is formed in the second semiconductor layer in a region including the inner surface of the trench;
forming an insulating film so as to cover the inner surface of the trench of the second semiconductor layer;
burying a trench electrode in the trench of the second semiconductor layer so as to be covered with the insulating film;
forming an anode electrode on the surface of the second semiconductor layer opposite to the first semiconductor layer so as to be in contact with the trench electrode; and
forming a cathode electrode on a surface of the first semiconductor layer opposite to the second semiconductor layer,
wherein the wet etching is performed after an annealing treatment to the region including the inner surface of the trench, and
wherein both of the annealing treatment and the wet etching are performed after forming the trench on the second semiconductor layer by the dry etching and before forming the insulating film on the inner surface of the trench of the second semiconductor layer.

9. The method for producing a trench MOS Schottky diode according to claim 8, wherein a principal plane of the second semiconductor layer comprises a plane parallel to a b-axis, and the trench has a linear plane pattern parallel to a [010] direction.

* * * * *